United States Patent [19]

Camin et al.

[11] Patent Number: 5,068,623
[45] Date of Patent: Nov. 26, 1991

[54] HIGH-GAIN AMPLIFIER WITH LOW NOISE AND LOW POWER DISSIPATION, USING FIELD EFFECT TRANSISTORS

[75] Inventors: Daniel V. Camin, Milano; Gianluigi Pessina, Lainate; Ezio Previtali, Curno, all of Italy

[73] Assignee: Istituto Nazionale Di Fisica Nucleare, Roma, Italy

[21] Appl. No.: 521,998

[22] Filed: May 11, 1990

[30] Foreign Application Priority Data

May 23, 1989 [IT] Italy ............................. 20610 A/89

[51] Int. Cl.$^5$ ............................. H03F 3/16
[52] U.S. Cl. ............................. 330/277; 330/296; 330/297; 330/311
[58] Field of Search ............. 330/277, 311, 296, 297

[56] References Cited

U.S. PATENT DOCUMENTS 4,100,438 7/1978 Yokoyama .................. 330/277 X
4,952,885 8/1990 Devecchi et al. .............. 330/277

OTHER PUBLICATIONS

Sherwin et al., "FETs As Constant-Current Sources," *EEE*, Oct. 1967, pp. 82-85.

*Primary Examiner*—James B. Mullins
*Attorney, Agent, or Firm*—Griffin Branigan & Butler

[57] ABSTRACT

The amplifier comprises a first field effect transistor controlled by the input signal of the amplifier and a current generator for the supply of said first transistor. The latter is biased so as to operate in its linear region and in cascade with it there is provided at least one second field effect transistor biased in a similar way, suitable for raising the output impedance of the amplifier, and thus its gain, to a value corresponding to the desired use.

3 Claims, 2 Drawing Sheets

HIGH-GAIN AMPLIFIER WITH LOW NOISE AND LOW POWER DISSIPATION, USING FIELD EFFECT TRANSISTORS

BACKGROUND

1. Field of the Invention

The present invention relates to a high-gain amplifier with low noise and low power dissipation, using field effect transistors.

2. Prior Art and other Conciderations

Field effect transistors (FET) have in the saturation region their maximum output impedance. The output impedance can be low in those transistors wherein, for reasons of construction geometry, it is not possible to saturate the channel region completely. On the other hand, in transistors wherein the dominant noise is the low frequency one (called 1/f noise) the optimum biasing point for the noise is in the linear region of the transistor, where the output impedance is always low and the drain/source voltage is in turn limited.

In the design of high-gain amplifiers, in particular but not exclusively in the dominant-pole ones, wherein a field effect transistor is supplied by a current generator and controlled by the input signal while the output is taken in an intermediate node between the transistor and the current generator, the voltage gain is determined by the product of the transistor transconductance by the impedance seen in said intermediate node, determined by the parallel combination of the output impedances of the transistor and of the current generator.

If the amplifier must also be of the low 1/f noise type, in view of what has been said above it is necessary that the transistor be biased in the linear region, where on the other hand the transistor has a low output impedance. The impedance seen in the output node of the amplifier thus has a modest value and as a consequence the voltage gain becomes low.

Another problem of amplifiers is represented by the quantity of power dissipated, which obviously translates into heat which can be particularly undesirable for uses such as those in low temperature operations.

In view of this state of the art, the essential object of the present invention has been to realize an amplifier with field effect transistors, which at the same time has low-noise and high-gain characteristics.

Another object of the present invention has been that of realizing a high-gain and low-noise amplifier, which also has low power-dissipation characteristics.

SUMMARY

According to the invention such objects have been attained with an amplifier comprising a first field effect transistor controlled by the input signal of the amplifier and a current generator for supplying said first transistor. The first transistor is biased so as to operate in its linear region. Cascaded with the first transitor is at least one second field effect transistor biased in a similar manner suitable for increasing the output impedance of the amplifier, and thus its gain, to a value corresponding to the desired use.

In this way, while the low-frequency noise level is kept low as desired, the gain of the amplifier is ensured at the required value. In addition, considering that the operation of field effect transistors in the linear region implies a low drain/source voltage, the amplifier is put into the position of operating with a reduced supply voltage which translates into a low dissipation of power and thus of heat.

BRIEF DESCRIPTION OF THE DRAWING

These and other features of the present invention shall be made evident by the following detailed description of its embodiments illustrated as a non-limiting example in the enclosed drawings, wherein.

DETAILED DESCRIPTION OF THE DRAWING

Figure 1:
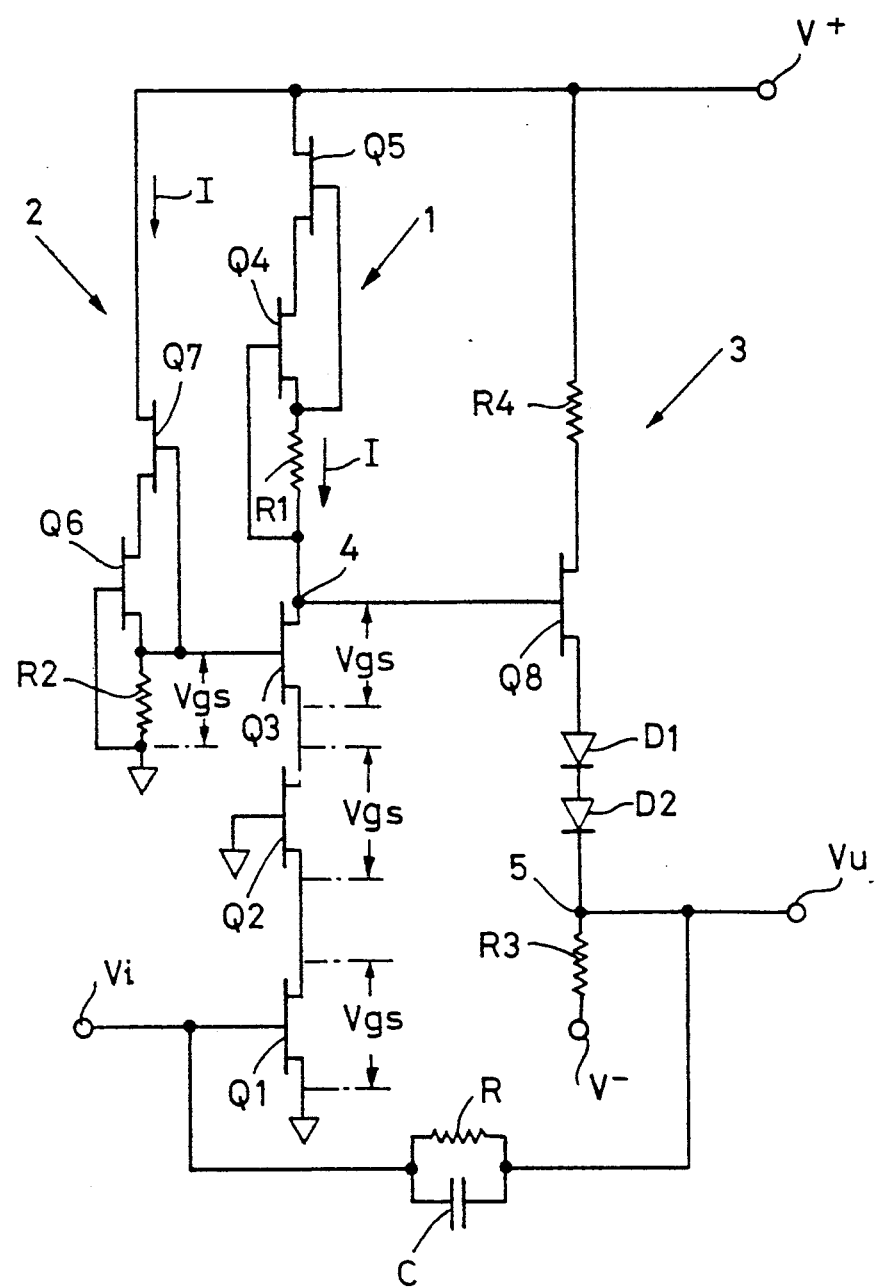
FIG. 1 shows a schematic circuit diagram of a first example of an amplifier according to the present invention.

FIG. 1 shows a current-integrator feedback operational amplifier, which incorporates the features of the present invention.

The operational amplifter of FIG. 1 essentially comprises three FET transistors in cascade, indicated with the alphanumeric references Q1, Q2 and Q3, respectively. Transistor Q1 has the input signal Vi of the amplifier applied to its gate electrode, its source electrode grounded and its drain electrode connected to the source electrode of transistor Q2. Transistor Q2 in turn has its gate grounded and drain connected to the source of transistor Q3. Transistor Q3 has its gate and its drain connected to a common positive power supply terminal V+ through two current generator circuits 1 and 2, through which flow currents I of identical value.

Circuit 1 comprises two FET transistors in cascade, having the same polarity and indicated with the alphanumeric references Q4 and Q5, respectively. Transistor Q4 has its gate connected to the drain of transistor Q3. The source of transistor Q4 is also connected to the drain of transistor Q3 through a resistance R1 and also connected to the gate of transistor Q5. The drain of transistor Q4 is connected to the source of transistor Q5. Transistor Q5 has it drain connected to the positive power supply V+. The resistance R1 thus has its opposite ends connected between the gate terminals of the transistors Q4 and Q5.

Circuit 2 similarly comprises two FET transistors in cascade, indicated with the alphanumeric references Q6 and Q7, respectively. Transistor Q6 has its gate grounded. The source of transistor Q6 is grounded through a resistance R2 having the same value as R1. The source of transistor Q6 is also connected to the gate of transistor Q3. The drain of transistor Q6 is connected to the source of transistor Q7. Transistor Q7 in turn has its gate connected to the source of transistor Q6 and its drain connected to the positive power supply V+. The resistance R2 thus has its opposite ends connected between the gate terminals of the transistors Q6 and Q7.

The amplifier of FIG. 1 also comprises a follower branch 3 formed by a FET transistor Q8 connected in series to two diodes D1 and D2 and to two resistances R3 and R4 between the positive power supply V+ and a terminal having a negative voltage V−. The gate of transistor Q8 is connected to an intermediate node 4 between resistance R1 and transistor Q3. An output voltage Vu is taken at node 5 which is intermediate diode D2 and the terminal V−.

The amplifier is lastly provided with a current integrator feedback constituted by the parallel connection of a resistance R and of a capacity C situated between the output Vu and the input Vi.

The transistors Q1 to Q8 just described are all of the dual-gate type. The transistors Q1 to Q8 are are advantageously interconnected, as shown as an example in FIG. 2, where the device as a whole is indicated with Q and the two interconnected gates are indicated with G1 and G2. It has been possible to check that in this way a structure is obtained which can behave like a single device with a double-length gate and as such with a 1/f noise whose value is four times smaller. This constitutes an important innovative element of the present invention, which allows the use of commercial-type devices obtaining from them an advantageous reduction in low frequency noise.

Going back to the circuit of FIG. 1, the various FET transistors Q1 to Q8 are biased so as to operate in their linear region rather than in saturation, so as to keep the 1/f noise generated in them low. This is obtained by acting on their bias so that the drain/source voltage of the transistors is set at a low value.

This effect is ensured in the circuit of FIG. 1 due to the fact that between drain and source of transistor Q1 and between drain and source of transistor Q2 there is the same voltage Vgs, which can be determined and fixed at a suitably low value across resistance R2 by the conduction of transistor Q6.

To compensate for the low value of the output impedance which derives from the low drain/source voltage described above which would otherwise lead to an undesirably low gain of the amplifier, the multiple cascade configuration of transistors Q1, Q2, Q3, is used. The multiple cascade configuration takes the gain back to the high required level.

The above low voltage value does, on the other hand, allow the power supply voltage V+ to be kept low with the consequent advantage of limiting the dissipation of power and thus the emanated heat.

It is also important to highlight the configuration used for the current generator circuit 1 of FIG. 1. Due to the connection between the source of transistor Q4 and the gate of transistor Q5, the latter forces transistor Q4 to work in the optimum point as regards low frequency noise and also with a bootstrap action it keeps the voltage between the source of transistors Q4 and Q5 unchanged as their instantaneous value changes due to the signal applied and in this way raises the low value of the output impedance of Q4. The overall dynamic impedance seen from the connecting node 4 is thus very high indeed.

Figure 2:
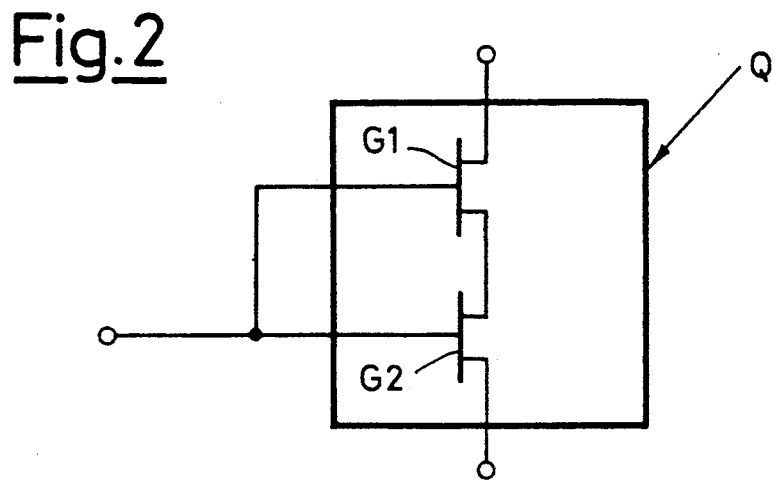
FIG. 2 shows an enlarged detail of a type of field effect transistor advantageously usable in the amplifier according to the invention.

The amplifier described above with reference to FIG.1 finds application in the scientific world, in particular for the amplification of the signal of detectors of particles operating at low temperatures. In these applications it is currently only possible to use silicon MOSFET or gallium arsenide MESFET transistors, which are the only ones which allow the conduction of current at low temperatures. These components have a dominant 1/f noise and thus the design criteria given above are valid for them, in particular as regards the interconnection of the gates as shown in FIG. 2. In particular the gallium arsenide MESFET's are manufactured for high-frequency applications and have a short gate since the maximum operating frequency is inversely proportional to the length of the gate. The availability of gallium arsenide commercial devices with a long gate is, on the other hand, very scarce, so that the use of twin-gate devices connected together has a particular interest.

Figure 3:
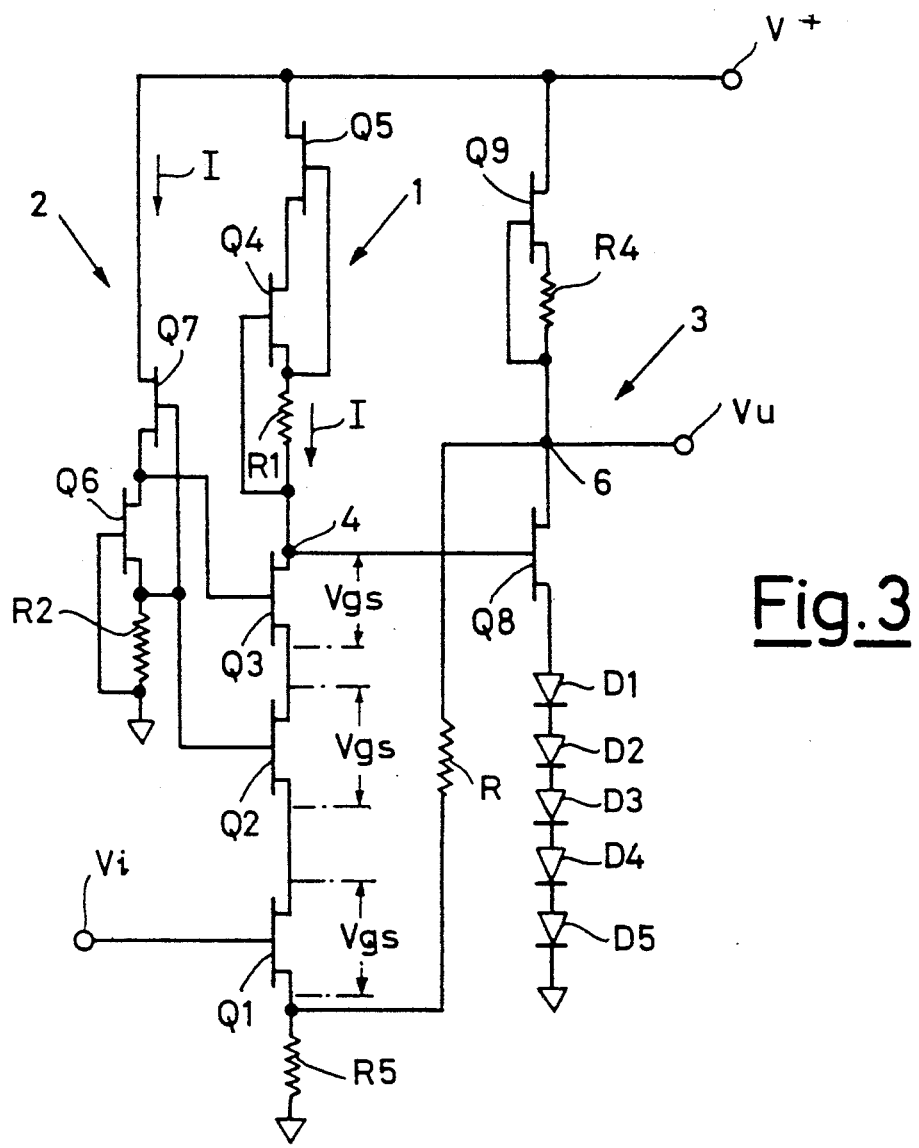
FIG. 3 shows a schematic circuit diagram of a second example of an amplifier according to the present invention.

FIG. 3 shows a variant of the amplifier according to the invention, which in such case operates as voltage feedback operational amplifier. As can be seen, the circuit diagram is still essentially the same, in particular with the three transistors Q1, Q2 and Q3 connected in cascade the transistors are biased so as to have a low drain/source voltage fixed by resistance R2 in combination with transistor Q6 and with the high-impedance current generator formed by transistors Q4 and Q5. Transistor Q2, however, has its gate connected to the source of transistor Q6 and transistor Q3 has its gate connected to the source of transistor Q7. In turn, transistor Q1 has its source grounded by means of a resistance R5. A FET transistor Q9 is connected in series to resistance R4 with the gate connected to the drain of transistor Q8. Further diodes D3, D4 and D5 are added to diodes D1 and D2, which connect the source of transistor Q8 to ground rather than to the negative voltage terminal V−. The output Vu is made available at a node 6 intermediate between resistance R4 and transistor Q8. Feedback is lastly represented by resistance R only. In this way, as already said, there is accomplished a voltage feedback operational amplifier, which for everything else includes all the innovative features incorporated in the amplifier of FIG. 3 and previously described.

We claim:

1. A high-gain amplifier comprising:
    a first field effect transistor controlled by an input signal of the amplifier;
    at least one second field effect transistor connected in cascade with said first transistor;
    a first current generator for power supply of said first and second transistors;
    a second current generator for biasing said first and second transistors so as to cause them to operate in respective linear regions of their characteristics;
    said first and second current generators being substantially equal to each other and including each a resistance and two serially connected field effect transistors having gate terminals respectively connected to opposite ends of said resistance so as to cause said two transistors to operate in respective linear regions of their characteristics.

2. The amplifier of claim 1, wherein the first current generator is connected between a drain of the second field effect transistor and a power supply; wherein the second current generator is connected between a gate of the second field effect transistor and the power supply; wherein the resistance included in the first current generator has a first terminal connected to a drain of the second field effect transistor comprising the amplifier and to a gate of a first of the two serially connected field effect transistors comprising the first current generator; wherein the resistance included in the first current generator has a second terminal connected to a source of the first of the two serially connected field effect transistors comprising the first current generator and to a gate of a second of the two serially connected field effect transistors comprising the first current generator; wherein the resistance included in the second current generator has a first terminal connected to a source of a first of the two serially connected field effect transistors comprising the second current generator and to a gate of a second of the two serially connected field effect transistors comprising the second current generator;

wherein the resistance included in the second current generator has a second terminal connected to a gate of the first of the two serially connected field effect transistors comprising the first current generator and to ground.

3. An amplifier according to claim 1 characterized in that all the field effect transistors include two interconnected gates.

* * * * *